US012725553B2

(12) United States Patent
Huang et al.

(10) Patent No.: US 12,725,553 B2
(45) Date of Patent: Sep. 1, 2026

(54) DISPLAY DEVICE, DRIVING METHOD THEREOF, AND ELECTRONIC PAPER

(71) Applicant: HUAWEI TECHNOLOGIES CO., LTD., Shenzhen (CN)

(72) Inventors: Qiangcan Huang, Dongguan (CN); Yizhen Lin, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/639,542

(22) Filed: Apr. 18, 2024

(65) Prior Publication Data

US 2024/0274056 A1 Aug. 15, 2024

Related U.S. Application Data

(63) Continuation of application No. PCT/CN2022/125369, filed on Oct. 14, 2022.

(30) Foreign Application Priority Data

Oct. 18, 2021 (CN) ........................ 202111207842.0

(51) Int. Cl.

| | |
|---|---|
| ***G09G 3/20*** | (2006.01) |
| ***G02F 1/167*** | (2019.01) |
| ***G02F 1/1677*** | (2019.01) |
| ***G09G 3/34*** | (2006.01) |
| ***H10D 86/40*** | (2025.01) |
| ***H10D 86/60*** | (2025.01) |
| *G02F 1/1675* | (2019.01) |

(52) U.S. Cl.
CPC ........... *G09G 3/2074* (2013.01); *G02F 1/167* (2013.01); *G02F 1/1677* (2019.01); *G09G 3/344* (2013.01); *H10D 86/441* (2025.01); *H10D 86/60* (2025.01); *G02F 2001/1678* (2013.01); *G09G 2300/08* (2013.01); *G09G 2320/0242* (2013.01)

(58) Field of Classification Search
CPC ...................................................... G09G 3/344
See application file for complete search history.

(56) References Cited

U.S. PATENT DOCUMENTS

2002/0167477 A1 11/2002 Tsutsui et al.
2007/0263257 A1 11/2007 Pai
2008/0224992 A1* 9/2008 Kim ....................... G09G 3/344 345/107

(Continued)

FOREIGN PATENT DOCUMENTS

CN 1351323 A 5/2002
CN 1841170 A 10/2006

(Continued)

*Primary Examiner* — Amr A Awad

(57) ABSTRACT

Embodiments of the disclosure provide a display device, a driving method thereof, and electronic paper. The display device includes a plurality of pixels. The pixel includes N subpixels whose pixel electrode areas are not equal to each other, the subpixel is capable of displaying M grayscales, and both N and M are integers not less than 2. A ratio of pixel electrode areas of two of the N subpixels is $X^n$, $2 \leq X \leq M$, and n is an integer not less than 1. In the disclosure, a quantity of displayed grayscales can be increased, and a refresh rate of a displayed image can be ensured.

20 Claims, 11 Drawing Sheets

(56) References Cited

U.S. PATENT DOCUMENTS

| | | | | |
|---|---|---|---|---|
| 2010/0149158 | A1* | 6/2010 | Lee | G09G 3/344 345/214 |
| 2011/0234562 | A1* | 9/2011 | Hong | G09G 3/344 359/296 |
| 2015/0185948 | A1* | 7/2015 | Chang | G06F 3/0416 345/174 |
| 2018/0164644 | A1 | 6/2018 | Jiang et al. | |
| 2019/0107765 | A1* | 4/2019 | Whitehead | G02F 1/315 |

FOREIGN PATENT DOCUMENTS

| | | | |
|---|---|---|---|
| CN | 1892775 | A | 1/2007 |
| CN | 101324732 | A | 12/2008 |
| CN | 102338900 | A | 2/2012 |
| CN | 104536225 | A | 4/2015 |
| CN | 108806629 | A | 11/2018 |
| CN | 112309337 | A | 2/2021 |
| JP | 2000338918 | A | 12/2000 |
| JP | 2003186451 | A | 7/2003 |
| JP | 2006503321 | A | 1/2006 |
| JP | 2007010811 | A | 1/2007 |
| JP | 2007171711 | A | 7/2007 |
| JP | 2007212854 | A | 8/2007 |
| JP | 2009122401 | A | 6/2009 |
| JP | 2009216950 | A | 9/2009 |
| JP | 2011186148 | A | 9/2011 |
| JP | 2012181507 | A | 9/2012 |
| JP | 2014235422 | A | 12/2014 |
| JP | 2017107175 | A | 6/2017 |
| KR | 100371841 | B1 | 2/2003 |
| KR | 20110057077 | A | 5/2011 |

* cited by examiner

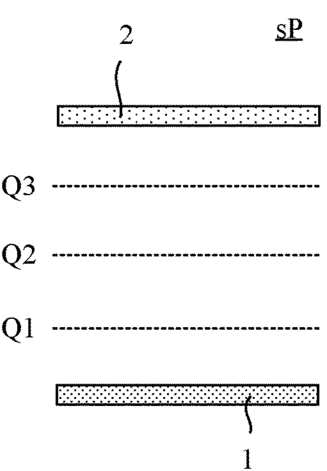
FIG. 6
| | $sP_1$ | $sP_2$ |
|---|---|---|
| 1 | $Q_1$ | $Q_1$ |
| 2 | $Q_2$ | $Q_1$ |
| 3 | $Q_3$ | $Q_1$ |
| 4 | $Q_1$ | $Q_2$ |
| 5 | $Q_2$ | $Q_2$ |
| 6 | $Q_3$ | $Q_2$ |
| 7 | $Q_1$ | $Q_3$ |
| 8 | $Q_2$ | $Q_3$ |
| 9 | $Q_3$ | $Q_3$ |
FIG. 7
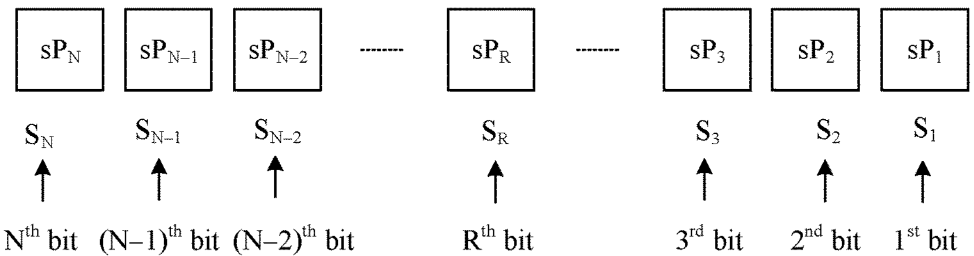
FIG. 8

| Grayscale | sP1 | sP2 | sP3 | Pixel luminance |
|---|---|---|---|---|
| Gr0 | 0 | 0 | 0 | 0 |
| Gr1 | 1/7 | 0 | 0 | 1/7 |
| Gr2 | 0 | 2/7 | 0 | 2/7 |
| Gr3 | 1/7 | 2/7 | 0 | 3/7 |
| Gr4 | 0 | 0 | 4/7 | 4/7 |
| Gr5 | 1/7 | 0 | 4/7 | 5/7 |
| Gr6 | 0 | 2/7 | 4/7 | 6/7 |
| Gr7 | 1/7 | 2/7 | 4/7 | 1 |

FIG. 13

| Grayscale | sP1 | sP2 | Pixel luminance |
|---|---|---|---|
| Gr0 | 0 | 0 | 0 |
| Gr1 | 1/15 | 0 | 1/15 |
| Gr2 | 2/15 | 0 | 2/15 |
| Gr3 | 3/15 | 0 | 3/15 |
| Gr4 | 0 | 4/15 | 4/15 |
| Gr5 | 1/15 | 4/15 | 5/15 |
| Gr6 | 2/15 | 4/15 | 6/15 |
| Gr7 | 3/15 | 4/15 | 7/15 |
| Gr8 | 0 | 8/15 | 8/15 |
| Gr9 | 1/15 | 8/15 | 9/15 |
| Gr10 | 2/15 | 8/15 | 10/15 |
| Gr11 | 3/15 | 8/15 | 11/15 |
| Gr12 | 0 | 12/15 | 12/15 |
| Gr13 | 1/15 | 12/15 | 13/15 |
| Gr14 | 2/15 | 12/15 | 14/15 |
| Gr15 | 3/15 | 12/15 | 1 |

FIG. 14

| Grayscale | sP1 | sP2 | sP3 | Pixel luminance |
|---|---|---|---|---|
| Gr0 | 0 | 0 | 0 | 0 |
| Gr1 | 1/26 | 0 | 0 | 1/26 |
| Gr2 | 2/26 | 0 | 0 | 2/26 |
| Gr3 | 0 | 3/26 | 0 | 3/26 |
| Gr4 | 1/26 | 3/26 | 0 | 4/26 |
| Gr5 | 2/26 | 3/26 | 0 | 5/26 |
| Gr6 | 0 | 6/26 | 0 | 6/26 |
| Gr7 | 1/26 | 6/26 | 0 | 7/26 |
| Gr8 | 2/26 | 6/26 | 0 | 8/26 |
| Gr9 | 0 | 0 | 9/26 | 9/26 |
| Gr10 | 1/26 | 0 | 9/26 | 10/26 |
| Gr11 | 2/26 | 0 | 9/26 | 11/26 |
| Gr12 | 0 | 3/26 | 9/26 | 12/26 |
| Gr13 | 1/26 | 3/26 | 9/26 | 13/26 |
| Gr14 | 2/26 | 3/26 | 9/26 | 14/26 |
| Gr15 | 0 | 6/26 | 9/26 | 15/26 |
| Gr16 | 1/26 | 6/26 | 9/26 | 16/26 |
| Gr17 | 2/26 | 6/26 | 9/26 | 17/26 |
| Gr18 | 0 | 0 | 18/26 | 18/26 |
| Gr19 | 1/26 | 0 | 18/26 | 19/26 |
| Gr20 | 2/26 | 0 | 18/26 | 20/26 |
| Gr21 | 0 | 3/26 | 18/26 | 21/26 |
| Gr22 | 1/26 | 3/26 | 18/26 | 22/26 |
| Gr23 | 2/26 | 3/26 | 18/26 | 23/26 |
| Gr24 | 0 | 6/26 | 18/26 | 24/26 |
| Gr25 | 1/26 | 6/26 | 18/26 | 25/26 |
| Gr26 | 2/26 | 6/26 | 18/26 | 1 |

FIG. 15

| Grayscale | sP1 | sP2 | Pixel luminance |
|---|---|---|---|
| Gr0 | 0 | 0 | 0 |
| Gr1 | 1/9 | 0 | 1/9 |
| Gr2 | 2/9 | 0 | 2/9 |
| Gr3 | 3/9 | 0 | 3/9 |
| Gr4 | 0 | 2/9 | 2/9 |
| Gr5 | 1/9 | 2/9 | 3/9 |
| Gr6 | 2/9 | 2/9 | 4/9 |
| Gr7 | 3/9 | 2/9 | 5/9 |
| Gr8 | 0 | 4/9 | 4/9 |
| Gr9 | 1/9 | 4/9 | 5/9 |
| Gr10 | 2/9 | 4/9 | 6/9 |
| Gr11 | 3/9 | 4/9 | 7/9 |
| Gr12 | 0 | 6/9 | 6/9 |
| Gr13 | 1/9 | 6/9 | 7/9 |
| Gr14 | 2/9 | 6/9 | 8/9 |
| Gr15 | 3/9 | 6/9 | 1 |

DISPLAY DEVICE, DRIVING METHOD THEREOF, AND ELECTRONIC PAPER

CROSS-REFERENCE TO RELATED APPLICATIONS

This application is a continuation of international application PCT/CN2022/125369, filed on Oct. 14, 2022, which claims priority to Chinese Patent Application No. 202111207842.0, filed on Oct. 18, 2021. The disclosures of the aforementioned applications are hereby incorporated by reference in their entireties.

TECHNICAL FIELD

This application pertains to the field of display technologies, and more specifically, relates to a display device, a driving method thereof, and electronic paper.

BACKGROUND

With continuous development of display technologies, an electronic paper display technology gains attention in public eyes due to its paper-like display effect. Electrophoretic particles used in the electronic paper display technology have a bistable characteristic, so that an electronic paper display can still retain a displayed image for a long time when the electronic paper display stops working. Therefore, the electronic paper display features low power consumption. The electronic paper display technology is of a reflective display type. That is, display effect is achieved by reflecting an external light source. Therefore, the electronic paper display technology is far less harmful to human eyes than an LCD or OLED display technology.

In a current electronic paper display technology, there are few grayscales that can be displayed by pixels. However, if the grayscales that can be displayed by the pixels are increased only by adjusting a driving manner, it is more difficult to control precision of the grayscales. In addition, in the conventional technology, after the grayscales that can be displayed by the pixels are increased, a refresh rate of a displayed image is greatly affected, and smoothness of animation playing is severely affected.

SUMMARY

In view of this, the present disclosure provides a display device, a driving method thereof, and electronic paper, to resolve a technical problem brought by increasing a quantity of grayscales that can be displayed by a pixel and improving control precision of the grayscales.

An embodiment of the disclosure provides a display device, including:

- a plurality of pixels, where the pixel includes N subpixels whose pixel electrode areas are not equal to each other, the subpixel is capable of displaying M grayscales, and both N and M are integers not less than 2.

A ratio of pixel electrode areas of two of the N subpixels is $X^n$, $2 \le X \le M$, and n is an integer not less than 1.

In the disclosure, displayed grayscales of the pixel are presented by combining grayscales displayed by the N subpixels, so that a quantity of grayscales displayed by the pixel can be increased. Compared with the conventional technology, the disclosure can greatly reduce density of grayscale tracks corresponding to the grayscales, and can improve precision of grayscale control. In addition, a time required for the pixel to complete free switching between all grayscales can be reduced, and a refresh rate of a displayed image is slightly affected while the quantity of displayed grayscales is increased, thereby ensuring smoothness of animation playing. When X=M, a maximum of $M^N$ grayscales can be displayed on the pixel only by controlling each subpixel to separately display M grayscales, thereby greatly increasing the quantity of displayed grayscales.

In some implementations, $n \le N-1$. In this embodiment, a ratio of pixel electrode areas of two subpixels with a largest difference in pixel electrode areas is $X^{N-1}$.

In some implementations, the N subpixels include a first subpixel, a second subpixel, . . . , and an $N^{th}$ subpixel. A ratio of a pixel electrode area of an $(R+1)^{th}$ subpixel to a pixel electrode area of an $R^{th}$ subpixel is X, where $1 \le R \le N$, and R is an integer. The ratio of the pixel electrode area of the $(R+1)^{th}$ subpixel to the pixel electrode area of the $R^{th}$ subpixel can be minimized based on the design in this embodiment. In this case, a total area of a single pixel is minimum, so that a quantity of pixels disposed in the display device can be increased, thereby improving resolution.

In some implementations, a proportion of the pixel electrode area of the $R^{th}$ subpixel in the N subpixels in a total pixel electrode area of the pixel is $P_R$, where $P_R = X^{R-1} * (X-1)/(X^N-1)$, $1 \le R \le N$, and R is an integer.

In this embodiment of the disclosure, the display device includes a plurality of gate lines and a plurality of data lines. The subpixel includes a switching transistor, and an output terminal of the switching transistor is electrically connected to a pixel electrode. Control terminals of switching transistors of the N subpixels are electrically connected to a same gate line, and input terminals of the switching transistors of the N subpixels are respectively connected to different data lines. In this implementation, N subpixels belonging to a same pixel are controlled by a same gate line, and data voltages of the N subpixels are respectively provided by different data lines.

In some implementations, input terminals of switching transistors of the N subpixels are connected to a same data line, and control terminals of the switching transistors of the N subpixels are respectively connected to different gate lines. In this implementation, N subpixels belonging to a same pixel are respectively controlled by different gate lines, and data voltages of the N subpixels are provided by a same data line.

A pixel structure in this embodiment of the disclosure is one of the following:

- pixel electrodes of the subpixels are strip-shaped, and the N subpixels are sequentially arranged in a same direction;
- pixel electrodes of the subpixels are block-shaped, and the N subpixels are arranged in an array;
- pixel electrodes of at least some of the subpixels are ring-shaped, and the N subpixels are arranged in a nested manner; and
- pixel electrodes of at least some of the subpixels are L-shaped, and two adjacent subpixels in the N subpixels are arranged in a way that one of the subpixels is half-encircled by the other subpixel. A shape and an arrangement manner of the subpixels may be designed according to a specific design requirement.

In an embodiment, the pixel includes at least a red pixel, a green pixel, and a blue pixel. The display device includes an optical filter layer, and the optical filter layer includes a red optical filter unit, a green optical filter unit, and a blue optical filter unit. The red pixel includes the red optical filter unit, the green pixel includes the green optical filter unit, and the blue pixel includes the blue optical filter unit. This implementation provides a color display device, where a color filter unit is disposed to implement a color display. Each subpixel can independently display M grayscales. In this case, each pixel can independently display a maximum of $M^N$ grayscales, so that a quantity of displayed grayscales can be increased, thereby increasing color richness displayed in a color image.

In another embodiment, the red pixel includes a black electrophoretic particle and a red electrophoretic particle, the green pixel includes a black electrophoretic particle and a green electrophoretic particle, and the blue pixel includes a black electrophoretic particle and a blue electrophoretic particle. In this implementation, a color display is implemented by setting color electrophoretic particles in pixels.

An embodiment of the disclosure further provides a driving method of a display device, which is used to drive the display device provided in this embodiment of the disclosure. The driving method includes:

during display of a frame of image: controlling duration of a data voltage on a pixel electrode of a subpixel, so that the subpixel displays a target grayscale, where the target grayscale is any one of M grayscales, and grayscales displayed by N subpixels are combined to present displayed grayscales of a pixel.

In some implementations, the driving method further includes: displaying an initial grayscale of the subpixel before the frame of image is displayed, where the initial grayscale is any one of the M grayscales.

The controlling duration of a data voltage on a pixel electrode of a subpixel, so that the subpixel displays a target grayscale includes: providing, by the gate line, a scan signal to control the switching transistor to be turned on, to write the data voltage to the pixel electrode by using the data line. The subpixel is switched from the initial grayscale to the target grayscale under control of the data voltage. The duration of the data voltage is T, and T=m*t. m is a positive integer not less than 1, and t is a scanning period at which the gate line provides a scan signal.

An embodiment of the disclosure further provides electronic paper, including the display device provided in any embodiment of the disclosure.

The display device, the driving method thereof, and the electronic paper that are provided in the disclosure have the following beneficial effects.

A pixel includes N subpixels whose pixel electrode areas are not equal. Each subpixel can independently display M grayscales, and a pixel electrode area ratio of the subpixel is related to M. Displayed grayscales of the pixel are presented by combining grayscales displayed by the N subpixels. A maximum of $M^N$ grayscales can be displayed on the pixel only by controlling each subpixel to separately display M grayscales, thereby increasing a quantity of displayed grayscales. Applied to an electronic paper display technology, the disclosure can greatly reduce density of grayscale tracks corresponding to the grayscales, and can improve precision of grayscale control. In addition, a time required for the pixel to complete free switching between all grayscales can be reduced, and a refresh rate of a displayed image is slightly affected while the quantity of displayed grayscales is increased, thereby ensuring smoothness of animation playing.

BRIEF DESCRIPTION OF DRAWINGS

FIG. 6 is a schematic diagram of a grayscale track of a subpixel according to an embodiment of the disclosure;

FIG. 7 shows an arrangement and combination manner of grayscale tracks corresponding to grayscales of a pixel according to the disclosure;

FIG. 8 is a schematic diagram of equating a quantity of grayscales that can be displayed by a pixel to an N-bit M-base number;

FIG. 13 is a schematic diagram of a combination of grayscale display luminance of a pixel according to the disclosure;

FIG. 14 is a schematic diagram of another combination of grayscale display luminance of a pixel according to the disclosure;

FIG. 15 is a schematic diagram of another combination of grayscale display luminance of a pixel according to the disclosure;

DESCRIPTION OF EMBODIMENTS

A display device applied to an electronic paper display technology includes a common electrode and a pixel electrode that are disposed opposite to each other, and electrophoretic particles located between the common electrode and the pixel electrode. After a voltage is separately applied to the common electrode and the pixel electrode, movement of the electrophoretic particles can be controlled. However, if final locations of the electrophoretic particles in a pixel are different after movement, luminance obtained by reflection of the pixel is also different. Therefore, the pixel can present different grayscales.

For case of description of subsequent embodiments, a concept of a grayscale track is introduced in the disclosure, and the grayscale track is in a one-to-one correspondence with a grayscale displayed by the pixel. A display device including a black electrophoretic particle and a white electrophoretic particle is used as an example, and a location of the white electrophoretic particle in a pixel grayscale display may be defined as a grayscale track of the grayscale.

Figures 1, 2:
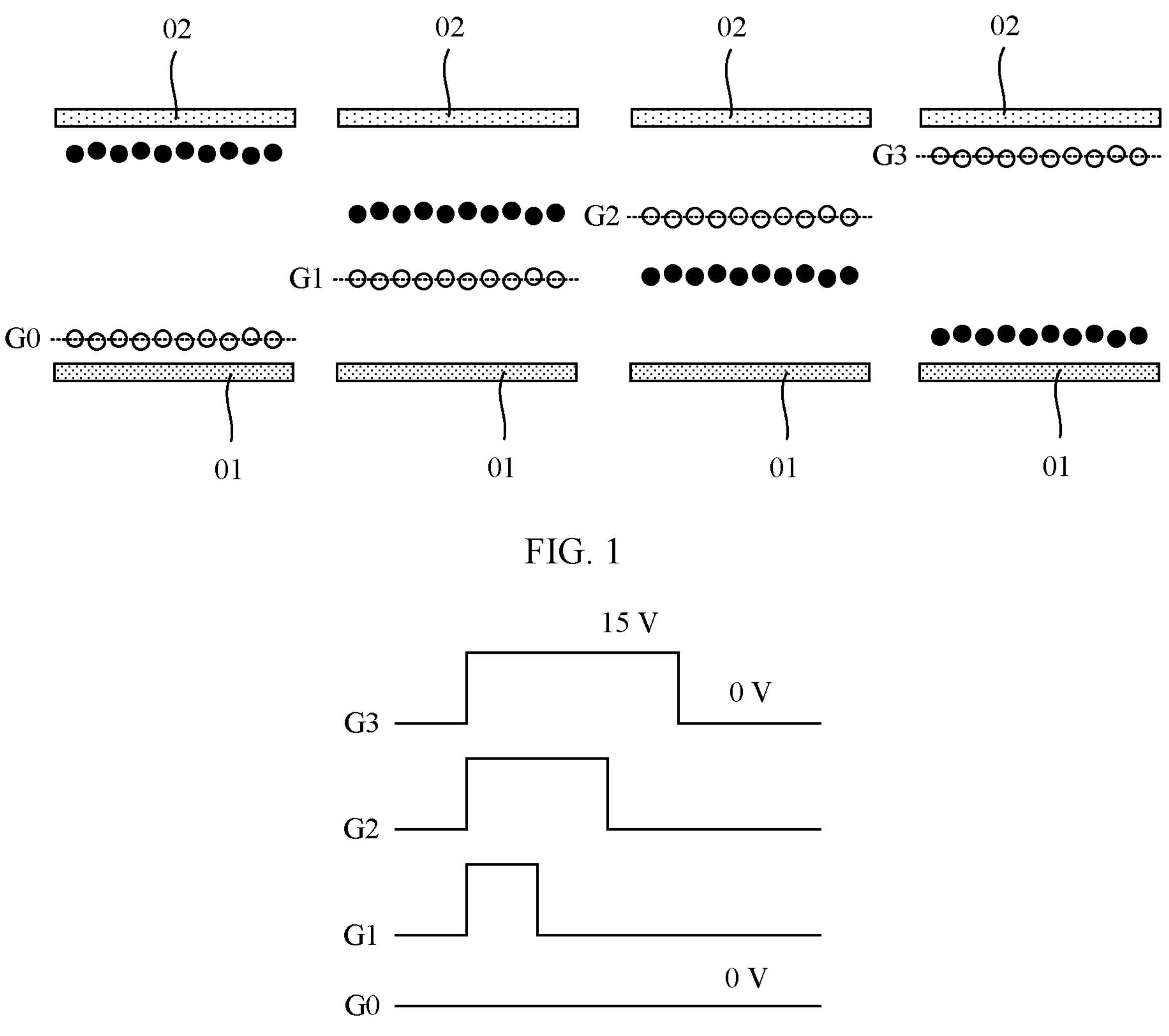
FIG. 1 is a schematic diagram of driving a 4-grayscale display device in the conventional technology.
FIG. 2 is a driving timing diagram of FIG. 1.

FIG. 1 is a schematic diagram of driving a 4-grayscale display device in the conventional technology, and FIG. 2 is a driving timing diagram of FIG. 1. The 4-grayscale display device means that a pixel in the display device can display four grayscales.

FIG. 1 shows states of electrophoretic particles when a pixel separately displays grayscales of G0, G1, G2, and G3. Locations of white electrophoretic particles in the pixel grayscale display are grayscale tracks of the grayscales. As shown in FIG. 1, the display device includes a pixel electrode 01, a common electrode 02, black electrophoretic particles, and white electrophoretic particles.

White electrophoretic particles with positive charges and black electrophoretic particles with negative charges are used as an example. A voltage applied to the common electrode 02 is 0 V, and three voltages of 0 V, 15 V, and −15 V are applied to the pixel electrode 01, to drive the electrophoretic particles to move, so that the pixel displays different grayscales. FIG. 2 is a timing diagram of driving a pixel to display different grayscales when an initial display state is a black image. When the initial display state is a black image, that is, the pixel displays the G0 grayscale, and when a voltage of 0 V is applied to the pixel electrode 01, the black electrophoretic particles and the white electrophoretic particles both maintain an original location and remain static, and the pixel continues to display the G0 grayscale. As shown in the timing diagram in FIG. 2, the pixel can display the G1 grayscale, the G2 grayscale, or the G3 grayscale by applying an impulse voltage of 15 V to the pixel electrode 01 and controlling duration of the impulse voltage.

It may be understood that, when the initial display state is a white image, that is, when the pixel displays the G3 grayscale, a voltage of 0 V is applied to the pixel electrode 01, the black electrophoretic particles and the white electrophoretic particles both maintain an original location and remain static, and the pixel continues to display the G3 grayscale. However, the pixel can display the G2 grayscale, the G1 grayscale, or the G0 grayscale by applying an impulse voltage of −15 V to the pixel electrode 01 and controlling duration of the impulse voltage.

Figure 3:
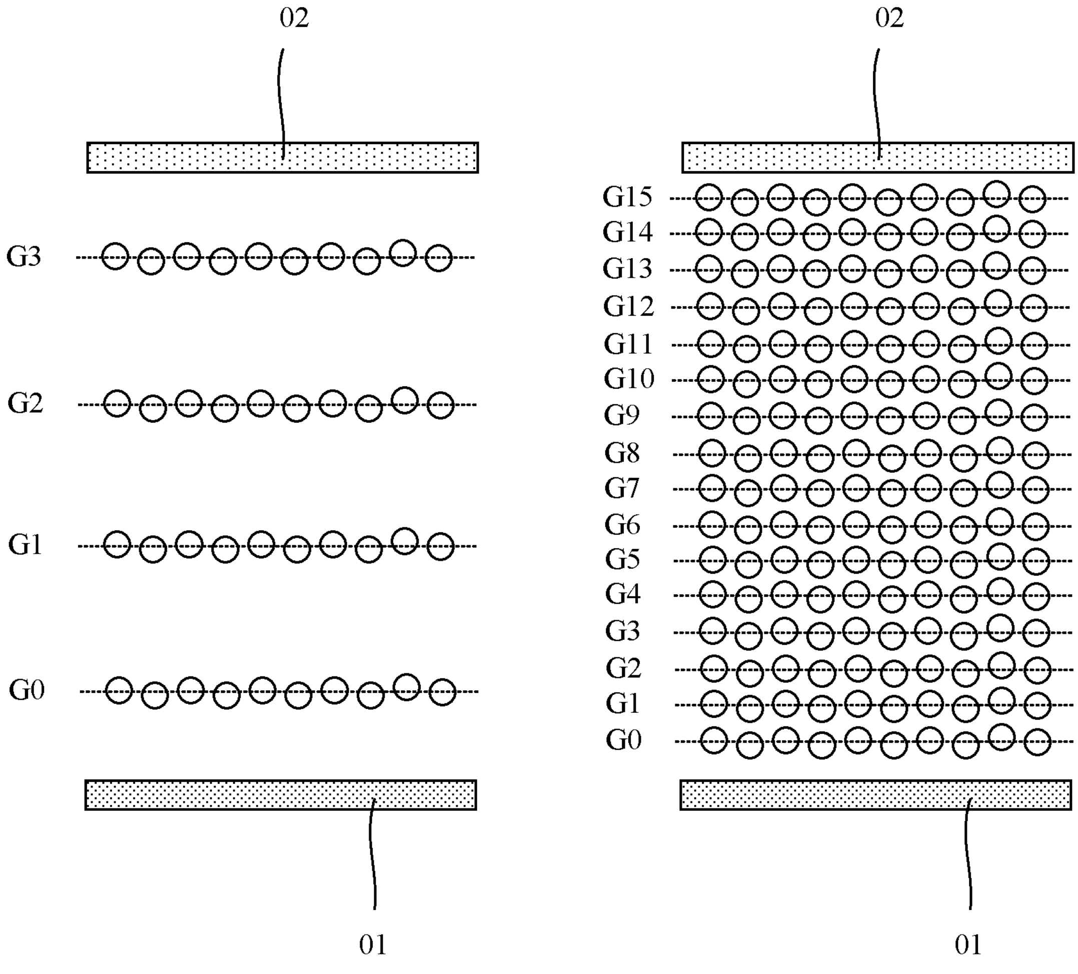
FIG. 3 is a schematic diagram of grayscale tracks of a 4-grayscale display device and a 16-grayscale display device in the conventional technology.
Figure 4:
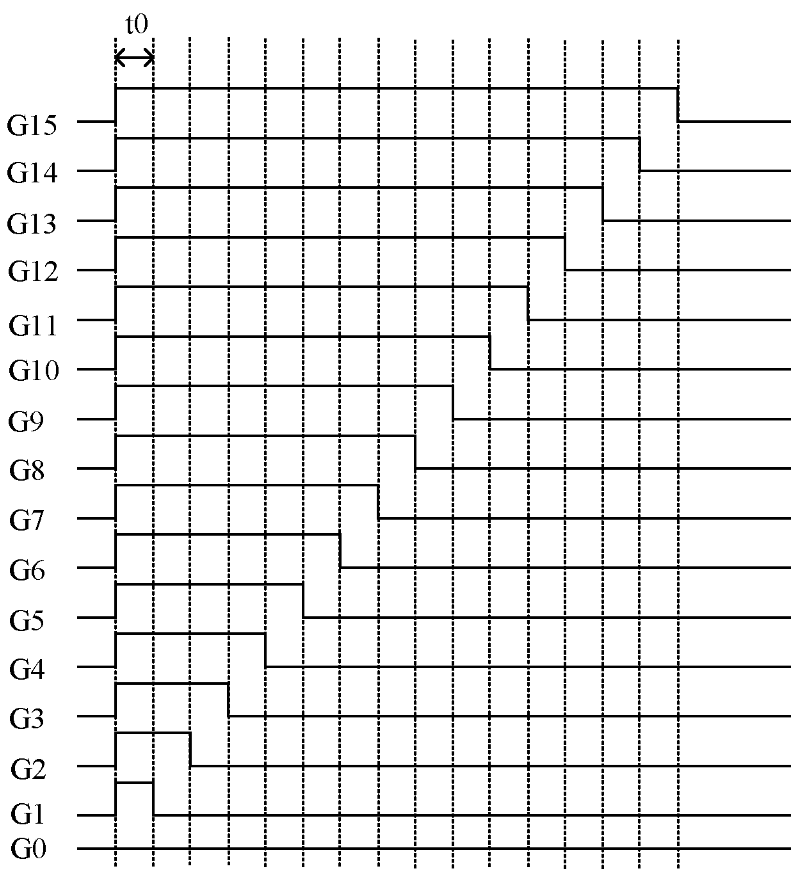
FIG. 4 is a driving timing diagram of a 16-grayscale display device.

FIG. 3 is a schematic diagram of grayscale tracks of a 4-grayscale display device and a 16-grayscale display device in the conventional technology, and FIG. 4 is a driving timing diagram of a 16-grayscale display device.

FIG. 3 shows only white electrophoretic particles and corresponding grayscale tracks. A pixel in the 4-grayscale display device can display four grayscales of G0 to G3, and a pixel in the 16-grayscale display device can display 16 grayscales of G0 to G15. A spacing between the pixel electrode 01 and the common electrode 02 in the display device needs to meet a specific requirement. When the spacing between the pixel electrode 01 and the common electrode 02 is fixed, a larger quantity of grayscales that can be displayed by controlling the pixel indicates denser corresponding grayscale tracks, that is, a shorter distance between adjacent grayscale tracks. In this case, it is more difficult to control grayscale precision.

FIG. 4 is a timing diagram of driving a pixel to display different grayscales when an initial display state is a black image. As shown in FIG. 4, when the initial display state is a black image, a specific impulse voltage is applied to the pixel electrode 01, and duration of the impulse voltage is controlled, so that any grayscale of G0 to G15 can be displayed on the pixel. A closer distance of the white electrophoretic particle to the common electrode 02 indicates a higher level of the grayscale displayed the pixel. A higher level of the grayscale displayed by the pixel indicates longer duration of applying a voltage to the pixel electrode 01. When the pixel is controlled to switch from displaying the G0 grayscale to displaying the G15 grayscale, duration of applying a voltage to the pixel electrode 01 is longest.

For example, the duration of the impulse voltage is an integer multiple of a minimum unit time t0. The minimum unit time t0 is a scanning period of a line scan signal. The scanning period of the line scan signal is a time used by all gate lines of the display device to provide a scan signal once, that is, a time used by the display device to refresh a frame. For example, in a mode of a refresh rate at 85 Hz, the scanning period is about 11.7 ms. That is, t0≈11.7 ms. As shown in FIG. 4, the duration of the impulse voltage when the pixel is controlled to switch from displaying the G0 grayscale to displaying the G1 grayscale is t0, and the duration of the impulse voltage when the pixel is controlled to switch from displaying the G0 grayscale to displaying the G15 grayscale is 15*10. Therefore, in an ideal state, in the 16-grayscale display device, to complete free switching between all grayscales of G0 to G15, a maximum of 15 frames need to be refreshed. For example, if the refresh rate is 85 Hz, a maximum switching frequency of a displayed image is 5 Hz to 6 Hz. In other words, in the conventional technology, a larger quantity of grayscales that can be displayed indicates a lower refresh rate of the displayed image, which affects smoothness of animation playing.

In addition, with the development of display technologies, electronic paper is not limited to a black and white display, and color electronic paper has become a new display technology. For a display device that can be applied to color electronic paper, when a color display is completed, three types of pixels, namely, red, green, and blue, are required for cooperation. A larger quantity of pixel grayscales indicates a richer color image to be displayed. However, in the conventional technology, an increase of a quantity of grayscales displayed by the pixel is limited, and a balance between the quantity of grayscales and an image display effect cannot be achieved.

Based on a problem in the conventional technology, the disclosure provides a display device and a driving method thereof. A pixel is divided into N subpixels whose pixel electrode areas are not equal to each other, and each subpixel is controlled to independently display M grayscales, where both N and M are integers not less than 2. Then, pixel areas of the subpixels are designed, so that grayscales displayed by the N subpixels are combined to present displayed grayscales of the pixel. In this way, a quantity of displayed grayscales can be increased, and a color display can be implemented while ensuring a refresh rate of the displayed image.

Figure 5:
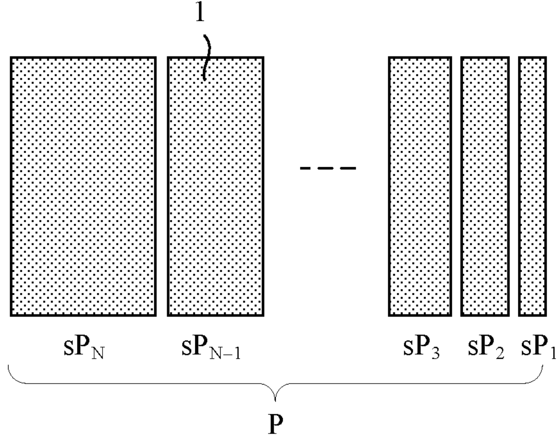
FIG. 5 is a schematic diagram of a pixel in a display device according to an embodiment of the disclosure.

In an embodiment, FIG. 5 is a schematic diagram of a pixel in a display device according to an embodiment of the disclosure, and FIG. 6 is a schematic diagram of a grayscale track of a subpixel according to an embodiment of the disclosure.

FIG. 5 shows only a pixel electrode 1 in a pixel P. As shown in FIG. 5, the pixel P includes N subpixels whose areas are not equal to each other, which are respectively: a first subpixel $sP_1$, a second subpixel $sP_2$, a third subpixel $sP_3$ to an $(N-1)^{th}$ subpixel $sP_{N-1}$, and an $N^{th}$ subpixel $sP_N$. Each subpixel sP can independently display M grayscales, and both N and M are integers not less than 2. Optionally, for one subpixel sP, M grayscales correspond to M grayscale levels. When M is not less than 3, a luminance difference between any two adjacent grayscales in the M grayscales is equal.

FIG. 6 shows three grayscale tracks $Q_1$, $Q_2$, and $Q_3$ of the subpixel sP when M=3. FIG. 6 further shows a pixel electrode 1 and a common electrode 2 that drive a displayed grayscale of the subpixel sP to perform switching. In an embodiment, the subpixel includes a black electrophoretic particle and a white electrophoretic particle, and a location of the white electrophoretic particle when the subpixel sP displays a grayscale is defined as a grayscale track of the grayscale. For example, when a user uses the common electrode 2 that is closer to human eyes than the pixel electrode 1, a grayscale track $Q_1$ corresponds to a low grayscale, and a grayscale track $Q_3$ corresponds to a high grayscale.

In one pixel P, a ratio of pixel electrode areas of two of the N subpixels sP is $X^n$, 2≤X≤M, and n is an integer not less than 1. Optionally, X is an integer. In other words, in the disclosure, the ratio of pixel electrode areas of the two subpixels sP is related to a quantity of grayscales that can be independently displayed by the subpixel sP.

In this embodiment of the present invention, the N subpixels include a first subpixel, a second subpixel, a third subpixel, . . . , and an $N^{th}$ subpixel whose pixel electrode areas gradually increase. It should be noted that a sorting number herein is not an actual arrangement sequence of the N subpixels in the display device.

In an embodiment, a ratio of a pixel electrode area of an $(R+1)^{th}$ subpixel to a pixel electrode area of an $R^{th}$ subpixel is M, where 1≤R≤N, and R is an integer. At this time, n=1. In other words, pixel electrode areas of the N subpixels increase by M times. In this case, a ratio of a pixel electrode area of an $(R+2)^{th}$ subpixel to the pixel electrode area of the $R^{th}$ subpixel is $M^2$, and at this time, n=2. When N is equal to 5, a ratio of a pixel electrode area of a fifth subpixel to a pixel electrode area of the first subpixel is M+, and at this time, n is a maximum value, and n=4=N−1. In this embodiment, a ratio of pixel electrode areas of two subpixels with a largest difference in pixel electrode areas is $M^{N-1}$. When M is a fixed value, the ratio of the pixel electrode area of the $(R+1)^{th}$ subpixel to the pixel electrode area of the $R^{th}$ subpixel can be minimized based on the design in this embodiment. In this case, a total area of a single pixel is minimum, so that a quantity of pixels disposed in the display device can be increased, thereby improving resolution.

In another embodiment, the ratio of the pixel electrode area of the $(R+1)^{th}$ subpixel to the pixel electrode area of the $R^{th}$ subpixel is $M^2$. In other words, pixel electrode areas of the N subpixels increase by $M^2$ times. In this embodiment, when N=5, the ratio of pixel electrode areas of the fifth subpixel and the first subpixel, namely, two subpixels with the largest difference in pixel electrode areas, is $M^8$. At this time, n is a maximum value, and n=8.

In another embodiment, the ratio of the pixel electrode area of the $(R+1)^{th}$ subpixel to the pixel electrode area of the $R^{th}$ subpixel is not fixed. In other words, pixel electrode areas of the N subpixels do not increase by an equal multiple. For example, when N=5, a ratio of a pixel electrode area of the second subpixel to the pixel electrode area of the first subpixel is M, a ratio of a pixel electrode area of the third subpixel to the pixel electrode area of the second subpixel is $M^2$, a ratio of a pixel electrode area of a fourth subpixel to the pixel electrode area of the third subpixel is M, and a ratio of the pixel electrode area of the fifth subpixel to the pixel electrode area of the fourth subpixel is $M^3$.

In some implementations, the ratio of the pixel electrode area of the $(R+1)^{th}$ subpixel to the pixel electrode area of the $R^{th}$ subpixel is $X^n$.

For example, M=4, and N=2. In an embodiment, if X=2, and n=1, a ratio of pixel electrode areas of two subpixels is 1:2. In another embodiment, if X=3, and n=1, a ratio of pixel electrode areas of two subpixels is 1:3. In another embodiment, if X=4, and n=1, a ratio of pixel electrode areas of two subpixels is 1:4.

For example, M=6, and N=2. In an embodiment, if X=2, and n=1, a ratio of pixel electrode areas of two subpixels is 1:2. In another embodiment, if X=3, and n=1, a ratio of pixel electrode areas of two subpixels is 1:3. In another embodiment, if X=6, and n=1, a ratio of pixel electrode areas of two subpixels is 1:6. In another embodiment, if X=6, and n=2, a ratio of pixel electrode areas of two subpixels is 1:4.

In an embodiment, the ratio of the pixel electrode area of the $(R+1)^{th}$ subpixel to the pixel electrode area of the $R^{th}$ subpixel is X. In other words, pixel electrode areas of the N subpixels increase by X times.

In the disclosure, one pixel includes N subpixels whose pixel electrode areas are not equal, the N subpixels each can display M grayscales, and a ratio of pixel electrode areas of two subpixels in the N subpixels is $X^n$. In other words, a ratio of pixel electrode areas of two subpixels is related to a quantity M of grayscales that can be displayed by the subpixels. In this case, the N subpixels each display any grayscale and then are combined as displayed grayscales of one pixel, so that a quantity of grayscales displayed by the pixel can be increased. In addition, when X=M, there is no repeated grayscale when the N subpixels are combined after each of the N subpixels displays any grayscale, and one pixel can display $M^N$ grayscales by combining grayscales displayed by the N subpixels. In other words, in the disclosure, a pixel can display a maximum of $M^N$ grayscales.

FIG. 7 shows an arrangement and combination manner of grayscale tracks corresponding to grayscales of a pixel according to the disclosure. As shown in FIG. 7, M=3, and N=2. That is, one pixel includes two subpixels $sP_1$ and $sP_2$, each subpixel can display three grayscales, and grayscale tracks corresponding to the three grayscales are $Q_1$, $Q_2$, and $Q_3$. There are nine combination manners of grayscales of the two subpixels in total, and the pixel can display nine grayscales.

During display, a grayscale displayed by each of the subpixels sP is controlled based on data information of a to-be-displayed image, so that each of the subpixels sP displays a target grayscale, where the target grayscale is any one of the M grayscales. In this case, displayed grayscales of the pixel can be presented by combining grayscales displayed by the N subpixels, and grayscales displayed by a plurality of pixels are combined to display a frame of image. A polarity of a data voltage applied to a pixel electrode of the subpixel sP and duration of the data voltage are controlled, so that the subpixel sP displays the target grayscale.

In the disclosure, the displayed grayscales of the pixel are presented by combining grayscales displayed by the N subpixels. A maximum of MAN grayscales can be displayed on the pixel only by controlling each subpixel to display M grayscales, thereby increasing a quantity of displayed grayscales. Compared with the conventional technology that can implement display of $M^N$ grayscales, the disclosure can greatly reduce density of grayscale tracks corresponding to the grayscales, and can improve precision of grayscale control. In addition, a time required for the pixel to complete free switching between all grayscales can be reduced, and a refresh rate of a displayed image is slightly affected while the quantity of displayed grayscales is increased, thereby ensuring smoothness of animation playing.

With reference to FIG. 5, the pixel P includes N subpixels in total, including a first subpixel $sP_1$, a second subpixel $sP_2$, a third subpixel $sP_3$ to an $(N-1)^{th}$ subpixel $sP_{N-1}$, and an $N^{th}$ subpixel $sP_N$. Optionally, an area of the pixel electrode 1 gradually increases from the first subpixel $sP_1$ to the $N^{th}$ subpixel $sP_N$. Proportions of a pixel electrode area of each of the subpixels in a total pixel electrode area of the pixel are sequentially $P_1$, $P_2$, $P_3$, . . . , and $P_N$. The total pixel electrode area of the pixel is a sum of pixel electrode areas of the N subpixels.

In the disclosure, each subpixel can independently display M grayscales. That is, each subpixel includes M grayscale tracks. When the pixel can display MAN grayscales, a quantity of grayscales that can be displayed by the pixel may be considered as an N-bit M-base number, and each M-base number corresponds to one grayscale. In the M-base number, the M grayscale tracks respectively correspond to 0, 1, 2, . . . , M−2, and M−1.

FIG. 8 is a schematic diagram of equating a quantity of grayscales that can be displayed by a pixel to an N-bit M-base number. As shown in FIG. 8, a grayscale track $S_1$ of a first subpixel $sP_1$ corresponds to a first bit of the M-base number, a grayscale track $S_2$ of a second subpixel $sP_2$ corresponds to a second bit of the M-base number, a grayscale track $S_3$ of a third subpixel $sP_3$ corresponds to a third bit of the M-base number, a grayscale track $S_R$ of an $R^{th}$ subpixel $sP_R$ corresponds to an $R^{th}$ bit of the M-base number (R is an integer not greater than N), a grayscale track $S_{N-2}$ of an $(N-2)^{th}$ subpixel $sP_{N-2}$ corresponds to an $(N-2)^{th}$ bit of the M-base number, a grayscale track $S_{N-1}$ of an $(N-1)^{th}$ subpixel $sP_{N-1}$ corresponds to an $(N-1)^{th}$ bit of the M-base number, and a grayscale track $S_N$ of an $N^{th}$ subpixel $sP_N$ corresponds to an $N^{th}$ bit of the M-base number. In this case, a combination of grayscale tracks of the N subpixels may be considered as an N-bit M-base number $S_N S_{N-1} \ldots S_2 S_1$, where $S_1$, $S_2$, . . . , and $S_N$ each are any integer from M-base numbers 0 to M−1.

The N-bit M-base number $S_N S_{N-1} \ldots S_2 S_1$ indicates a $y^{th}$ grayscale among $M^N$ grayscales that can be displayed by the pixel, and a luminance proportion of the grayscale is represented as Gy. It is assumed that a grayscale gamma is 1.0. That is, luminance increases linearly as the grayscale increases. The following formula may be obtained based on a transformation relationship between an M-base system and a decimal system:

$$y = M^0 * S_1 + M^1 * S_2 + M^2 * S_3 + \ldots + M^{R-1} * S_R + \ldots + M^{N-3} * S_{N-2} + M^{N-2} * S_{N-1} + M^{N-1} * S_N \quad ①$$

$$Gy = \left(M^0 * S_1 + M^1 * S_2 + M^2 * S_3 + \ldots + M^{R-1} * S_R + \ldots + M^{N-3} * S_{N-2} + M^{N-2} * S_{N-1} + M^{N-1} * S_N\right)/\left(M^N - 1\right) \quad ②$$

In the disclosure, total luminance of a single pixel is a sum of luminance of N subpixels, and a proportion $L_R$ of luminance of an $R^{th}$ subpixel in total luminance of the pixel may be represented as: $L_R = S_R * P_R/(M-1)$, where $P_R$ is a proportion of a pixel electrode area of the $R^{th}$ subpixel in a total pixel electrode area of the pixel.

In this case, Gy may also be represented as:

$$Gy = S_1 * P_1/(M-1) + S_2 * P_2/(M-1) + S_3 * P_3/(M-1) + \ldots + S_R * P_R/(M-1) + \ldots + S_{N-2} * P_{N-2}/(M-1) + S_{N-1} * P_{N-1}/(M-1) + S_N * P_N/(M-1) \quad ③$$

After formulas 2 and 3 are combined, the following can be obtained:

$$P_R = M^{R-1} * (M-1)/\left(M^N - 1\right) \quad ④$$

In an embodiment, the proportion of the pixel electrode area of the $R^{th}$ subpixel in the total pixel electrode area of the pixel is $P_R = X^{R-1} * (X-1)/(X^N - 1)$ (formula ⑤). In this way, pixel electrode areas of the N subpixels increase by X times, and the N subpixels each display any grayscale and are combined as displayed grayscales of one pixel, so that a quantity of grayscales displayed by the pixel can be increased. In addition, when X=M, a maximum of $M^N$ grayscales can be displayed on the pixel, thereby greatly increasing the quantity of displayed grayscales of the display device.

Figure 9:
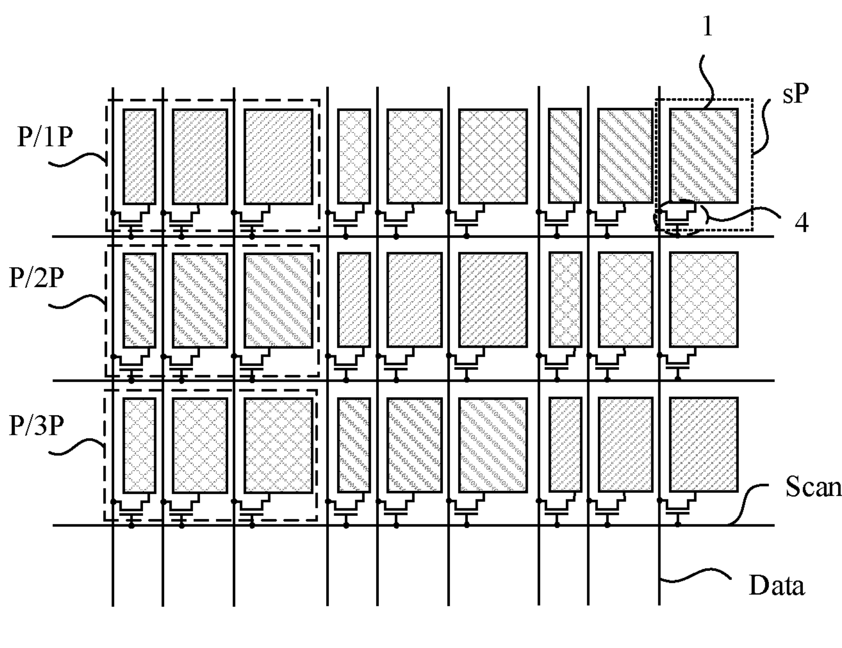
FIG. 9 is a schematic diagram of a display device according to an embodiment of the disclosure.

In an embodiment, FIG. 9 is a schematic diagram of a display device according to an embodiment of the disclosure. In FIG. 9, for example, N=3. As shown in FIG. 9, the display device includes a plurality of gate lines Scan and a plurality of data lines Data, and one pixel P includes three subpixels sP. A subpixel sP includes a switching transistor 4, and an output terminal of the switching transistor 4 is electrically connected to a pixel electrode 1. For one pixel P, control terminals of switching transistors 4 of the three subpixels sP are electrically connected to a same gate line Scan, and input terminals of the switching transistors 4 of the three subpixels sP are respectively connected to different data lines Data. When the display device is driven to display, the gate line Scan provides a scan signal to control the switching transistor 4 to be turned on, and the data line Data writes a data voltage signal to a pixel electrode of the subpixel sP. Electrophoretic particles move under an action of electrophoretic capacitance formed between the pixel electrode and a common electrode, to implement display of grayscales of the subpixels sP. Optionally, the subpixel sP further includes a storage capacitor. After the switching transistor 4 is turned on, the data line Data writes the data voltage signal to the pixel electrode, and stores the data voltage signal to the storage capacitor. In this implementation, N subpixels sP belonging to a same pixel P are controlled by a same gate line Scan, and data voltages of the N subpixels sP are respectively provided by different data lines Data.

Figure 10:
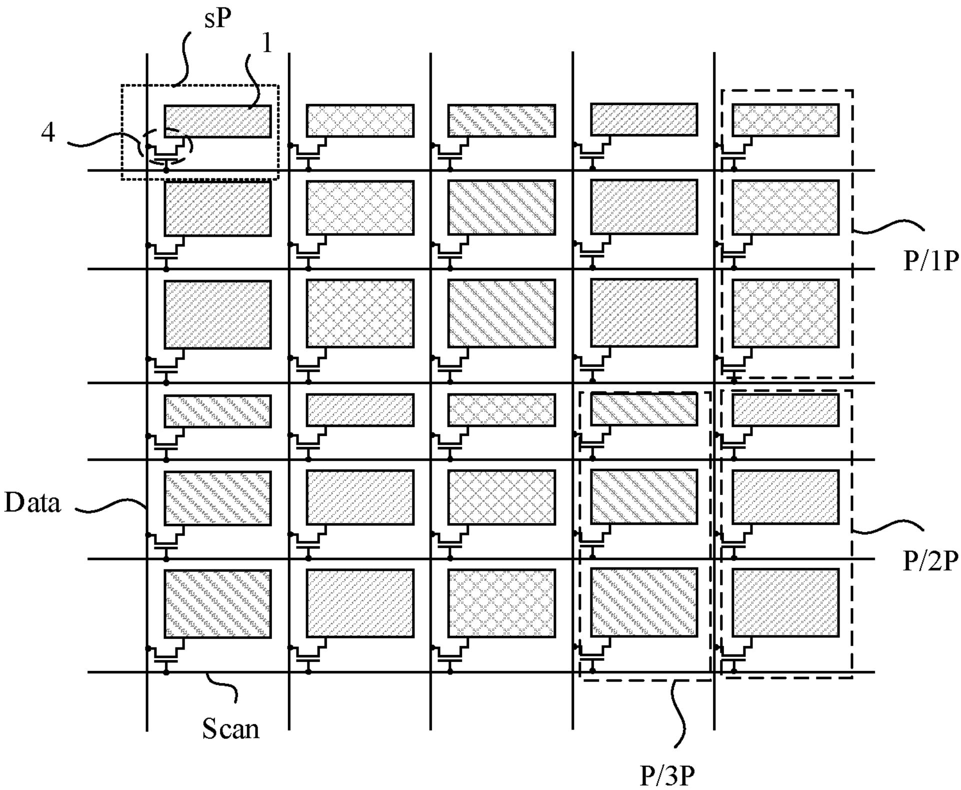
FIG. 10 is a schematic diagram of a display device according to an embodiment of the disclosure.

In another embodiment, FIG. 10 is a schematic diagram of another display device according to an embodiment of the disclosure. In FIG. 10, for example, N=3. As shown in FIG. 10, the display device includes a plurality of gate lines Scan and a plurality of data lines Data, and one pixel P includes three subpixels sP. For one pixel P, control terminals of switching transistors 4 of the three subpixels sP are respectively connected to different gate lines Scan, input terminals of the switching transistors 4 of the three subpixels sP are connected to a same data line Data, and an output terminal of a switching transistor 4 of each subpixel sP is connected to a corresponding pixel electrode 1. In this implementation, N subpixels sP belonging to a same pixel P are respectively controlled by different gate lines Scan, and data voltages of the N subpixels sP are provided by a same data line Data.

In an embodiment, the display device further includes a drive chip, and the gate line Scan and the data line Data each are electrically connected to the drive chip. When the display device is driven to work, the drive chip provides a corresponding voltage signal for each of the gate line Scan and the data line Data.

In the display device, a magnitude and duration of a data voltage required to drive the subpixel to display a target grayscale are related to a grayscale displayed by the subpixel during display of a previous frame of image. The grayscale displayed by the subpixel during display of the previous frame of image may be considered as an initial grayscale of the subpixel relative to the target grayscale. The initial grayscale is any one of the M grayscales. The target grayscale may be the same as the initial grayscale, or a difference between the target grayscale and the initial grayscale is at least one grayscale level.

In an embodiment in which a constant voltage of 0 V is applied to the common electrode during display, when a target grayscale of a subpixel is the same as the initial grayscale, a data voltage of 0 V is controlled to be written to a pixel electrode of the subpixel. At this time, an electrophoretic particle in the subpixel does not move, and a grayscale displayed by the subpixel is the same as the grayscale displayed by the subpixel during display of the previous frame of image.

When a difference between a target grayscale and an initial grayscale of a subpixel is at least one grayscale level, it is required to control, based on the difference between the target grayscale and the initial grayscale, to write a specific data voltage to a pixel electrode of the subpixel and control the data voltage to meet specific duration. The data voltage includes a polarity and a magnitude. Optionally, the magnitude and/or the polarity of the data voltage written to the pixel electrode is controlled, and the duration of the data voltage on the pixel electrode is controlled, to implement switching of the subpixel from the initial grayscale to the target grayscale.

In the display device, a time used by all gate lines Scan to provide a scan signal once is defined as a scanning period at which the gate lines provide the scan signal. It may be considered that the display device refreshes one frame after one scanning period is completed during working. For one gate line Scan, a scan signal is provided once in one scanning period. Displaying a frame of image means that image information of an image is completely displayed in a dynamic image.

In some implementations, the display device refreshes one frame to complete switching of all subpixels from the initial grayscale to the target grayscale. That is, the display device refreshes one frame to implement display of the frame of image.

In some implementations, after the display device refreshes a frame, switching from the initial grayscale to the target grayscale of all subpixels cannot be completed. In this case, the display device further needs to continue to refresh. That is, the gate line Scan continues to provide a scan signal, to ensure that the data voltage continues to be written to the pixel electrode of the subpixel. In other words, the duration of the data voltage needs to be prolonged. In this implementation, the display device needs to refresh two or more frames to complete display of one frame of image. The duration of the data voltage may also be understood as duration of maintaining the data voltage on the pixel electrode.

In some implementations, when the display device provided in this embodiment of the disclosure is driven to perform display, during display of a frame of image, the gate line Scan provides a scan signal to control the switching transistor 4 to be turned on, to provide the data voltage for the pixel electrode 1 by using the data line Data. Under control of the data voltage, the subpixel sP switches from the initial grayscale to the target grayscale. The duration of the data voltage is T, and T=m*t. m is a positive integer not less than 1, and t is a scanning period at which the gate line Scan provides a scan signal. The duration of the data voltage is related to a period at which the gate line Scan provides a scan signal. If the gate line Scan provides a scan signal once, the switching transistor 4 is turned on once, and the data line Data provides a data voltage for the pixel electrode 1 once. After the data voltage is written to the pixel electrode 1 once in the scanning period, a voltage value of the data voltage is maintained on the pixel electrode 1. In this implementation, a time used by the subpixel sP to switch from the initial grayscale to the target grayscale is an integer multiple of a scanning period t at which the gate line Scan provides a scan signal. Optionally, a larger grayscale level of difference between the target grayscale and the initial grayscale indicates a larger quantity of times that the gate line provides the scan signal when grayscale switching is controlled, that is, longer duration of the data voltage.

In some implementations, during display of a frame of image, a difference between the target grayscale and the initial grayscale is x grayscale levels, where $1 \le x \le M-1$, and x is an integer. In this case, when the subpixel sP is controlled to switch from the initial grayscale to the target grayscale, duration of the data voltage written to a pixel electrode of the subpixel sP is x*T1, where T1 is duration of the data voltage when the difference between the target grayscale and the initial grayscale is one grayscale level.

In some implementations, during display of a frame of image, a difference between the target grayscale and the initial grayscale is x grayscale levels. When $x \ge 2$, and the subpixel sP is controlled to switch from the initial grayscale to the target grayscale, a magnitude of the data voltage is adjusted to control duration of the data voltage written to a pixel electrode of the subpixel sP to be less than x*T1. In this way, a time for switching from the initial grayscale to the target grayscale can be shortened. For example, the subpixel sP shown in FIG. 6 includes three grayscale tracks $Q_1$, $Q_2$, and $Q_3$. During display of a frame of image, a target grayscale that needs to be displayed by the subpixel sP is a grayscale corresponding to the grayscale track $Q_2$. Before the image is displayed, an initial grayscale of the subpixel sP is a grayscale corresponding to the grayscale track $Q_1$.

Figures 11, 12:
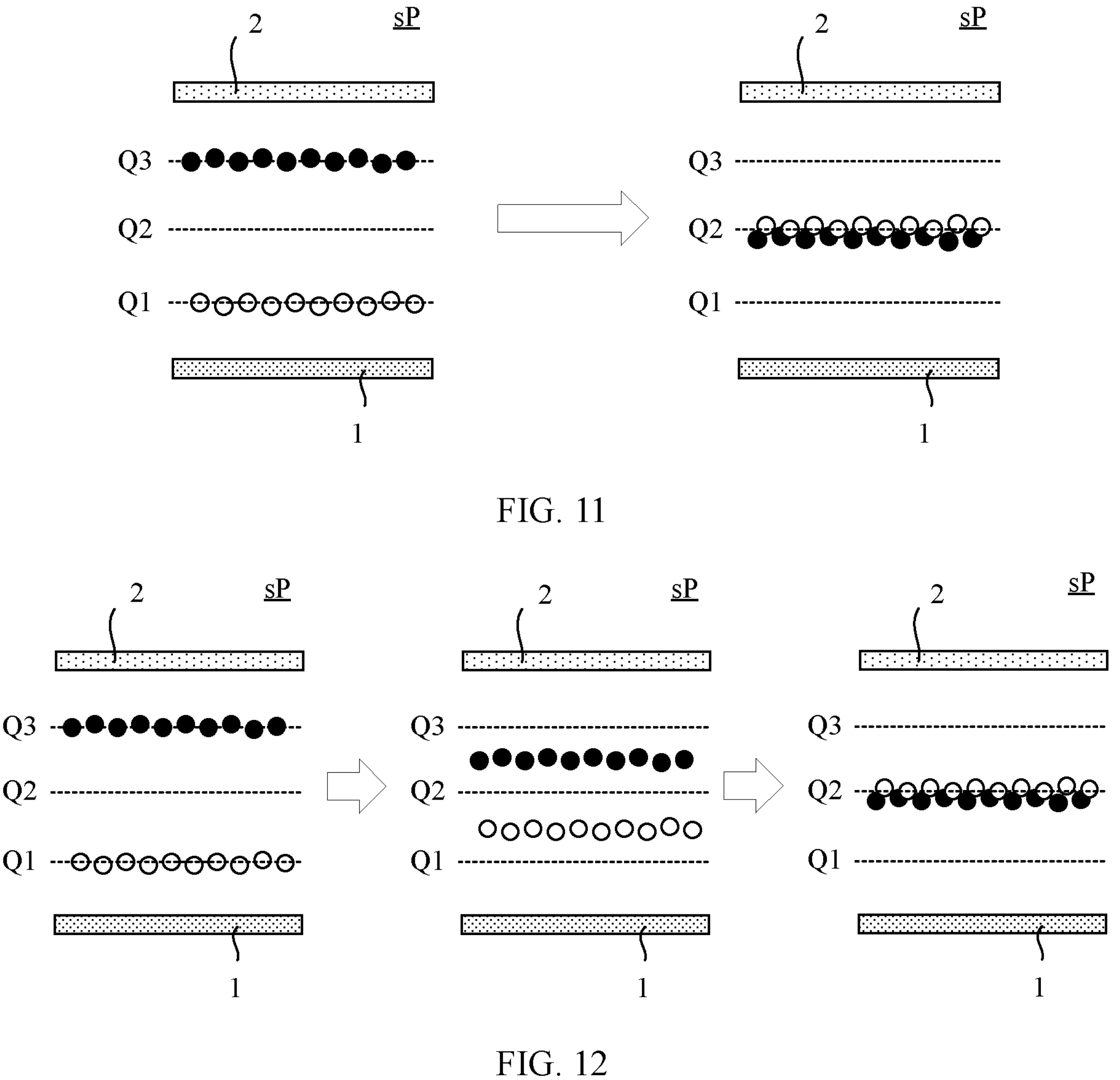
FIG. 11 is a schematic diagram of electrophoretic particle states in a subpixel before and after grayscale switching.
FIG. 12 is another schematic diagram of electrophoretic particle states in a subpixel before and after grayscale switching.

In an embodiment, FIG. 11 is a schematic diagram of electrophoretic particle states in a subpixel before and after grayscale switching. As shown in FIG. 11, after a gate line provides a scan signal once, white electrophoretic particles move to a position corresponding to a grayscale track $Q_2$. At this time, a subpixel sP displays a grayscale corresponding to the grayscale track $Q_2$. In a process of switching from a grayscale track $Q_1$ to the grayscale track $Q_2$, duration of a data voltage is T=1*t. It may be understood that, in a process of switching from the grayscale track $Q_1$ to a grayscale track $Q_3$, the duration of the data voltage is T=2*t, and m=2. Optionally, in this implementation, when a difference between a target grayscale and an initial grayscale is one grayscale level, duration of the data voltage is T1=t.

In another embodiment, FIG. 12 is another schematic diagram of electrophoretic particle states in a subpixel before and after grayscale switching. As shown in FIG. 12, after a gate line provides a scan signal once, white electrophoretic particles move to a position between a grayscale track $Q_2$ and a grayscale track $Q_1$. At this time, a subpixel sP displays luminance between a grayscale corresponding to the grayscale track $Q_2$ and a grayscale corresponding to the grayscale track $Q_1$, instead of luminance of a target grayscale. After the gate line provides the scan signal twice, the white electrophoretic particles move to a position corresponding to the grayscale track $Q_2$, and the subpixel sP displays the grayscale corresponding to the grayscale track $Q_2$. In a process of switching from the grayscale track $Q_1$ to the grayscale track $Q_2$, the duration of the data voltage is T=2*t, and m=2. That is, two line scanning periods are required for switching between adjacent grayscale levels. Optionally, in this implementation, in a process of switching from the grayscale track $Q_1$ to the grayscale track $Q_3$, the duration of the data voltage is T=4*t, and m=4. That is, four line scanning periods are required.

In an embodiment, M=2, and N=3. That is, one pixel P includes three subpixels $sP_1$, $sP_2$, and $sP_3$, each subpixel can independently display two grayscales, and the two grayscales respectively correspond to two grayscale tracks $Q_1$ and $Q_2$. For example, X=M=2. A ratio of pixel electrode areas of any two of the three subpixels is 2″, for example, 2, 4, or 8. Specifically, an example in which a pixel electrode area is set according to the foregoing formula ⑤ is used for description. According to formula ⑤, proportions of pixel electrode areas of the three subpixels in a total pixel electrode area of the pixel are respectively 1/7, 2/7, and 4/7. In an implementation in which a subpixel includes a black electrophoretic particle and a white electrophoretic particle, there are two grayscale tracks in total: $Q_1$ and $Q_2$. Luminance corresponding to the grayscale tracks $Q_1$ and $Q_2$ is all black (0) and all white (1) respectively. Ratios of luminance displayed by the grayscale tracks $Q_1$ and $Q_2$ corresponding to the subpixel sP1 to luminance when the pixel P is all white are respectively 0 and 1/7. Ratios of luminance displayed by the grayscale tracks $Q_1$ and $Q_2$ corresponding to the subpixel $sP_2$ to luminance when the pixel P is all white are respectively 0 and 2/7. Ratios of luminance displayed by the grayscale tracks $Q_1$ and $Q_2$ corresponding to the subpixel $sP_3$ to luminance when the pixel P is all white are respectively 0 and 4/7.

FIG. 13 is a schematic diagram of a combination of grayscale display luminance of a pixel according to the disclosure. As shown in FIG. 13, eight combinations of grayscale luminance may be obtained through arrangement and combination, thereby implementing display of eight grayscales. In addition, it may be learned from the foregoing related descriptions that, for a subpixel, a switching time between grayscale tracks of the subpixel is related to a quantity of scanning periods at which a gate line provides a scan signal. Therefore, for a subpixel having only two grayscale tracks $Q_1$ and $Q_2$, if the gate line provides a scan signal once to complete switching between the two grayscale tracks, only one scanning period needs to be performed to control switching between the two grayscale tracks in an ideal situation. For example, the display device works in a mode of a refresh rate at 85 Hz. Based on the design in this embodiment of the disclosure, a maximum image refresh rate of the display device may reach 85 Hz. For a conventional 8-grayscale display device, each pixel of the 8-grayscale display device has eight grayscale tracks in total. In this case, a switching time between grayscale tracks requires a maximum of seven scanning periods. Therefore, a maximum image refresh rate of the 8-grayscale display device can only reach 12 Hz. In addition, precision of corresponding grayscale control is relatively poor because of an increase in a quantity of grayscale tracks. In comparison with the conventional 8-grayscale display device, this embodiment of the disclosure can effectively improve an image refresh rate, and can improve precision of grayscale control.

In another embodiment, M=4, and N=2. That is, one pixel P includes two subpixels sP1 and $sP_2$, each subpixel can independently display four grayscales, and the four grayscales respectively correspond to four grayscale tracks $Q_1$, $Q_2$, $Q_3$, and $Q_4$. For example, X=M=4. A ratio of pixel electrode areas of the two subpixels is 4", for example, 4 or 16. Specifically, an example in which a pixel electrode area is set according to the foregoing formula ⑤ is used for description. According to formula ⑤, proportions of pixel electrode areas of the two subpixels in a total pixel electrode area of the pixel are respectively 1/4 and 4/5. In an implementation in which a subpixel includes a black electrophoretic particle and a white electrophoretic particle, there are four grayscale tracks in total: $Q_1$, $Q_2$, $Q_3$, and $Q_4$, and luminance respectively corresponding to the four grayscale tracks is all black (0), 1/3 white (1/3), 2/3 white (2/3), and all white (1). Ratios of luminance displayed by the grayscale tracks $Q_1$, $Q_2$, $Q_3$, and $Q_4$ corresponding to the subpixel sP1 to luminance when the pixel P is all white are respectively 0, 1/15, 2/15, and 3/15. Ratios of luminance displayed by the grayscale tracks $Q_1$, $Q_2$, $Q_3$, and $Q_4$ corresponding to the subpixel $sP_2$ to luminance when the pixel P is all white are respectively 0, 4/15, 8/15, and 12/15.

FIG. 14 is a schematic diagram of another combination of grayscale display luminance of a pixel according to the disclosure. As shown in FIG. 14, 16 combinations of grayscale luminance may be obtained through arrangement and combination, thereby implementing display of 16 grayscales. In addition, each subpixel includes four grayscale tracks. If the gate line provides a scan signal once to complete switching between two adjacent grayscale tracks, a maximum of three scanning periods need to be performed to control switching between the four grayscale tracks in an ideal situation. For example, the display device works in a mode of a refresh rate at 85 Hz. Based on the design in this embodiment of the disclosure, a maximum image refresh rate of the display device may reach 28 Hz. For a conventional 16-grayscale display, each pixel of the 16-grayscale display has 16 grayscale tracks in total. In this case, a switching time between grayscale tracks requires a maximum of 15 scanning periods. Therefore, a maximum image refresh rate of the 16-grayscale display can only reach 5 Hz to 6 Hz. In addition, precision of corresponding grayscale control is relatively poor because of an increase in a quantity of grayscale tracks. In comparison with the conventional 16-grayscale display, this embodiment of the disclosure can effectively improve an image refresh rate, and can improve precision of grayscale control. In another embodiment, M=3, and N=3. That is, one pixel P includes three subpixels $sP_1$, $sP_2$, and $sP_3$, each subpixel can independently display three grayscales, and the three grayscales respectively correspond to two grayscale tracks $Q_1$, $Q_2$, and $Q_3$. For example, X=M=3. A ratio of pixel electrode areas of the three subpixels is 3″, for example, 3, 9, or 27. Specifically, an example in which a pixel electrode area is set according to the foregoing formula ⑤ is used for description. According to formula ⑤, proportions of pixel electrode areas of the three subpixels in a total pixel electrode area of the pixel are respectively 2/26, 6/26, and 18/26. In an implementation in which a subpixel includes a black electrophoretic particle and a white electrophoretic particle, there are three grayscale tracks in total: $Q_1$, $Q_2$, and $Q_3$, and luminance respectively corresponding to the three grayscale tracks is all black (0), 1/2 white (1/2), and all white (1). Therefore, ratios of luminance displayed by the grayscale tracks $Q_1$, $Q_2$, and $Q_3$ corresponding to the subpixel sP1 to luminance when the pixel P is all white are respectively 0, 1/26, and 2/26. Ratios of luminance displayed by the grayscale tracks $Q_1$, $Q_2$, and $Q_3$ corresponding to the subpixel $sP_2$ to luminance when the pixel P is all white are respectively 0, 3/26, and 6/26. Ratios of luminance displayed by the grayscale tracks $Q_1$, $Q_2$, and $Q_3$ corresponding to the subpixel $sP_3$ to luminance when the pixel P is all white arc respectively 0, 9/26, and 18/26.

FIG. 15 is a schematic diagram of another combination of grayscale display luminance of a pixel according to the disclosure. As shown in FIG. 15, 27 combinations of grayscale luminance may be obtained through arrangement and combination, thereby implementing display of 27 grayscales. In addition, each subpixel includes three grayscale tracks. If the gate line provides a scan signal once to complete switching between two adjacent grayscale tracks, a maximum of two scanning periods need to be performed to control switching between the three grayscale tracks in an ideal situation. For example, the display device works in a mode of a refresh rate at 85 Hz. Based on the design in this embodiment of the disclosure, a maximum image refresh rate of the display device may reach 42 Hz. For a conventional 27-grayscale display, each pixel of the 27-grayscale display has 27 grayscale tracks in total. In this case, a switching time between grayscale tracks requires a maximum of 26 scanning periods. Therefore, a maximum image refresh rate of the 27-grayscale display can only reach 3 Hz. In addition, precision of corresponding grayscale control is poor because of an increase in a quantity of grayscale tracks. In comparison with the conventional 27-grayscale display, this embodiment of the disclosure can effectively improve an image refresh rate, and can improve precision of grayscale control.

In another embodiment, M=4, and N=2. That is, one pixel P includes two subpixels $sP_1$ and $sP_2$, each subpixel can independently display four grayscales, and the four grayscales respectively correspond to two grayscale tracks $Q_1$, $Q_2$, $Q_3$, and $Q_4$. For example, X=2<M. A ratio of pixel electrode areas of the two subpixels is 2", for example, 2 or 4. Specifically, when n=1, the ratio of the pixel electrode areas of the two subpixels is 2. According to formula ⑤, proportions of pixel electrode areas of the two subpixels in a total pixel electrode area of the pixel are respectively 1/3 and 2/3. In an implementation in which a subpixel includes a black electrophoretic particle and a white electrophoretic particle, there are four grayscale tracks in total: $Q_1$, $Q_2$, $Q_3$, and $Q_4$, and luminance respectively corresponding to the four grayscale tracks is all black (0), 1/3 white (1/3), 2/3 white (2/3), and all white (1). Ratios of luminance displayed by the grayscale tracks $Q_1$, $Q_2$, $Q_3$, and $Q_4$ corresponding to the subpixel sP1 to luminance when the pixel P is all white are respectively 0, 1/9, 2/9, and 3/9. Ratios of luminance displayed by the grayscale tracks $Q_1$, $Q_2$, $Q_3$, and $Q_4$ corresponding to the subpixel $sP_2$ to luminance when the pixel P is all white are respectively 0, 2/9, 4/9, and 6/9.

Figures 16, 17:
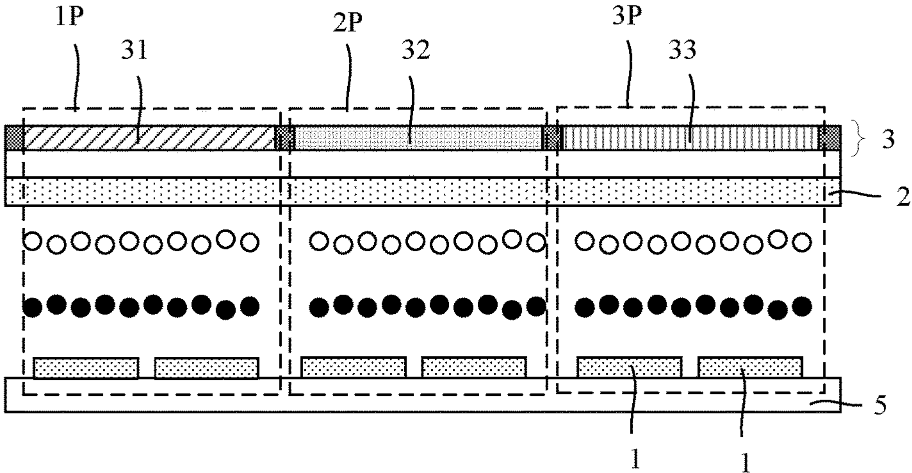
FIG. 16 is a schematic diagram of another combination of grayscale display luminance of a pixel according to the disclosure.
FIG. 17 is a simplified schematic diagram of a cross section of a display device according to an embodiment of the disclosure.

FIG. 16 is a schematic diagram of another combination of grayscale display luminance of a pixel according to the disclosure. As shown in FIG. 16, repeated grayscale luminance exists through arrangement and combination. In this implementation, 10 combinations of grayscale luminance may be obtained, thereby implementing display of 10 grayscales.

An embodiment of the disclosure further provides another display device. As shown in FIG. 9, a pixel includes at least a red pixel 1P, a green pixel 2P, and a blue pixel 3P. It should be noted that an arrangement manner of pixels of various colors is not limited in this embodiment of the disclosure, and arrangement manners of pixels of three colors in FIG. 9 are merely an example. Based on the design of the present invention, each pixel is divided into N subpixels, and each subpixel can independently display M grayscales, so that each pixel can independently display $X^N$ grayscales. A quantity of displayed grayscales can be increased, thereby increasing color richness displayed in a color image. In addition, a maximum of MY grayscales can be displayed by driving the subpixels to switch the grayscales among the M grayscale levels. A time required for the pixel to complete free switching between all grayscales can be reduced, and a refresh rate of a displayed image is slightly affected while the quantity of displayed grayscales is increased, thereby ensuring smoothness of animation playing.

In an embodiment, FIG. 17 is a simplified schematic diagram of a cross section of a display device according to an embodiment of the disclosure. As shown in FIG. 17, the display device includes an optical filter layer 3, and the optical filter layer 3 includes a red optical filter unit 31, a green optical filter unit 32, and a blue optical filter unit 33. The red pixel 1P includes the red optical filter unit 31, the green pixel 2P includes the green optical filter unit 32, and the blue pixel 3P includes the blue optical filter unit 33. FIG. 17 further shows a common electrode 2 and a pixel electrode 1. The display device further includes a substrate 5, where a gate line, a data line, and a switching transistor are located on the substrate 5. Each pixel further includes a white electrophoretic particle and a black electrophoretic particle, where the white electrophoretic particle is represented by white filling, and the black electrophoretic particle is represented by black filling. In this implementation, a color filter unit is disposed to implement a color display.

Figure 18:
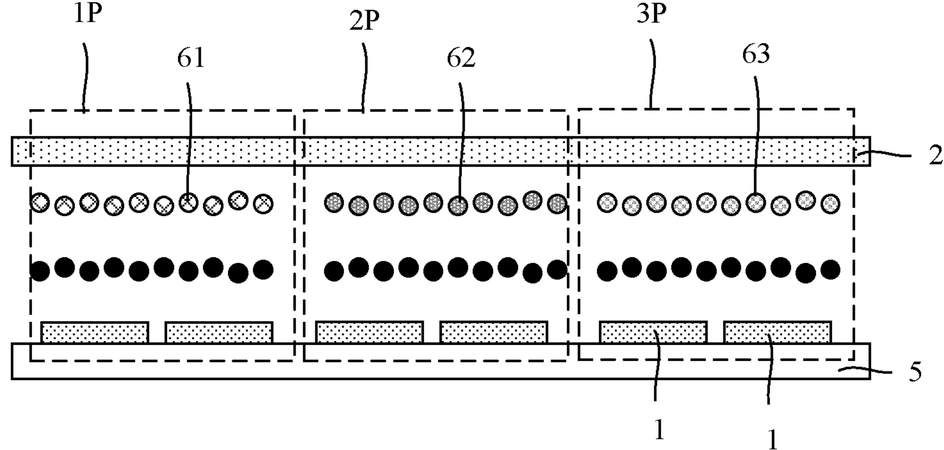
FIG. 18 is a simplified schematic diagram of a cross section of another display device according to an embodiment of the disclosure.

In another embodiment, FIG. 18 is a simplified schematic diagram of a cross section of another display device according to an embodiment of the disclosure. As shown in FIG. 18, the red pixel 1P includes a black electrophoretic particle and a red electrophoretic particle 61, the green pixel 2P includes a black electrophoretic particle and a green electrophoretic particle 62, and the blue pixel 3P includes a black electrophoretic particle and a blue electrophoretic particle 63. In this implementation, a color display is implemented by setting color electrophoretic particles in pixels.

In this embodiment of the disclosure, a shape of the subpixel may be set in a plurality of manners. Pixel electrodes 1 of subpixels sP illustrated in FIG. 5 are strip-shaped, and the N subpixels sP are sequentially arranged in a same direction. In an embodiment, the N subpixels sP arc randomly arranged in terms of a pixel electrode area. In another embodiment, the N subpixels sP are arranged in a way that pixel electrode areas gradually increase (or decrease).

Figure 19:
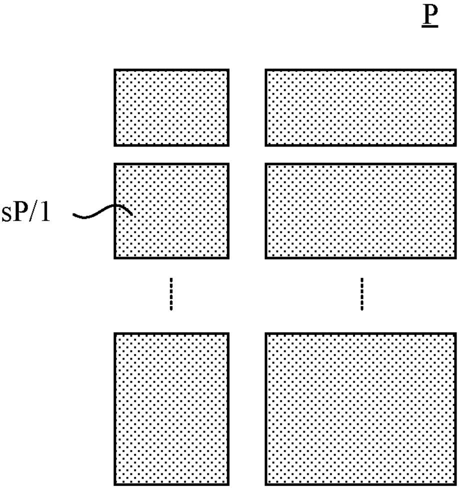
FIG. 19 is another schematic diagram of a pixel in a display device according to an embodiment of the disclosure.

In another embodiment, FIG. 19 is another schematic diagram of a pixel in a display device according to an embodiment of the disclosure. As shown in FIG. 19, pixel electrodes 1 of the subpixels sP are block-shaped, and the N subpixels sP are arranged in an array. In this implementation, the N subpixels sP are arranged into an array with a rows and b columns. A specific quantity of rows and columns may be set according to an actual requirement.

Figure 20:
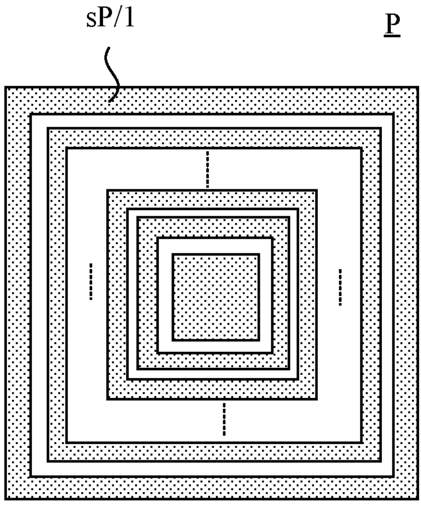
FIG. 20 is another schematic diagram of a pixel in a display device according to an embodiment of the disclosure.

In another embodiment, FIG. 20 is another schematic diagram of a pixel in a display device according to an embodiment of the disclosure. As shown in FIG. 20, pixel electrodes 1 of at least some of the subpixels sP are ring-shaped, and the N subpixels sP are arranged in a nested manner. Optionally, the N subpixels sP have a common symmetric center. Optionally, a pixel electrode of a subpixel sP located inside may be block-shaped. In FIG. 20, only pixel electrodes 1 of some subpixels sP are represented as rectangular rings for illustration. Optionally, the pixel electrodes 1 of the some subpixels sP may also be circular rings, elliptic rings, or polygonal rings.

Figure 21:
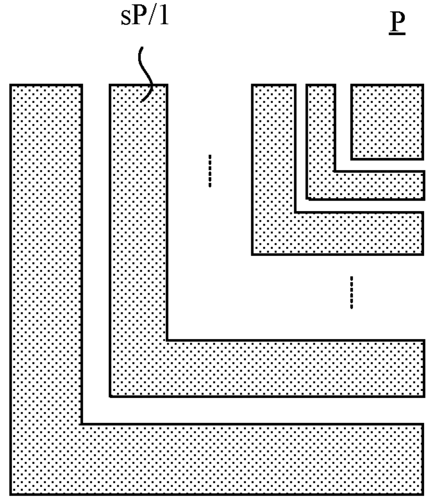
FIG. 21 is another schematic diagram of a pixel in a display device according to an embodiment of the disclosure.

In another embodiment, FIG. 21 is another schematic diagram of a pixel in a display device according to an embodiment of the disclosure. As shown in FIG. 21, pixel electrodes 1 of at least some of the subpixels sP are L-shaped, and two adjacent subpixels sP in the N subpixels sP are arranged in a way that one of the subpixels sP is half-encircled by the other subpixel sP. Optionally, a pixel electrode 1 of one of the N subpixels sP is block-shaped.

That the pixel electrode 1 is L-shaped herein means that a shape of the pixel electrode is approximately L-shaped, or that a shape of the pixel electrode is similar to "7".

An embodiment of the disclosure further provides electronic paper, including the display device provided in any embodiment of the disclosure. A structure of the display device is described in the foregoing embodiment, and details are not described herein again.

What is claimed is:

1. A display device, comprising:

a plurality of pixels, wherein each pixel of the plurality of pixels comprises N subpixels whose pixel electrode areas are not equal to each other, the N subpixels are capable of displaying M grayscales, and both N and M are integers not less than 2, wherein, a ratio of pixel electrode areas of two of the N subpixels is at least 2; wherein:

the display device comprises a plurality of gate lines and a plurality of data lines; and the subpixel comprises a switching transistor, a control terminal of the switching transistor is electrically connected to the gate line, an input terminal of the switching transistor is electrically connected to the data line, and an output terminal of the switching transistor is electrically connected to a pixel electrode; and the display device is configured to display an initial grayscale of the subpixel before the frame of image is displayed, wherein the initial grayscale is any one of the M grayscales and the controlling duration of a data voltage on a pixel electrode of the subpixel, so that the subpixel displays a target grayscale comprises:

providing, by a gate line, a scan signal to control a switching transistor to be turned on, to write the data voltage to the pixel electrode by using the data line, wherein the subpixel is switched from the initial grayscale to the target grayscale under control of the data voltage, the duration of the data voltage is T, and T=m*t, wherein m is a positive integer not less than 1, and t is a scanning period at which the gate line provides a scan signal.

2. The display device according to claim 1, wherein the ratio of pixel electrode areas is $X^n$, 2≤X≤M, and n is an integer not less than 1.

3. The display device according to claim 2, wherein:

the N subpixels comprise a first subpixel, a second subpixel, . . . , and an $N^{th}$ subpixel; and a ratio of a pixel electrode area of an $(R+1)^{th}$ subpixel to a pixel electrode area of an $R^{th}$ subpixel is X, wherein 1≤R≤N, and R is an integer.

4. The display device according to claim 3, wherein:

a proportion of the pixel electrode area of the $R^{th}$ subpixel in a total pixel electrode area of the pixel is $P_R$, wherein $P_R=X^{R-1}*(X-1)/(X^N-1)$, 1≤R≤N, and R is an integer.

5. The display device according to claim 2, wherein n≤N−1.

6. The display device according to claim 1, wherein:

the display device comprises a plurality of gate lines and a plurality of data lines;

the subpixel comprises a switching transistor, and an output terminal of the switching transistor is electrically connected to a pixel electrode; and control terminals of switching transistors of the N subpixels are connected to a same gate line, and input terminals of the switching transistors of the N subpixels are respectively connected to different data lines.

7. The display device according to claim 1, wherein:

the display device comprises a plurality of gate lines and a plurality of data lines;

the subpixel comprises a switching transistor, and an output terminal of the switching transistor is electrically connected to a pixel electrode; and input terminals of the switching transistors of the N subpixels are connected to a same data line, and control terminals of the switching transistors of the N subpixels are respectively connected to different gate lines.

8. The display device according to claim 1, wherein a structure of the pixel is one of the following:

pixel electrodes of the subpixels are strip-shaped, and the N subpixels are sequentially arranged in a same direction;

pixel electrodes of the subpixels are block-shaped, and the N subpixels are arranged in an array;

pixel electrodes of at least some of the subpixels are ring-shaped, and the N subpixels are arranged in a nested manner; and pixel electrodes of at least some of the subpixels are L-shaped, and two adjacent subpixels in the N subpixels are arranged in a way that one of the subpixels is half-encircled by the other subpixel.

9. The display device according to claim 1, wherein:

the pixel comprises at least a red pixel, a green pixel, and a blue pixel; and the display device comprises an optical filter layer, and the optical filter layer comprises a red optical filter unit, a green optical filter unit, and a blue optical filter unit, wherein the red pixel comprises the red optical filter unit, the green pixel comprises the green optical filter unit, and the blue pixel comprises the blue optical filter unit.

10. The display device according to claim 1, wherein:

the pixel comprises at least a red pixel, a green pixel, and a blue pixel; and the red pixel comprises a black electrophoretic particle and a red electrophoretic particle, the green pixel comprises a black electrophoretic particle and a green electrophoretic particle, and the blue pixel comprises a black electrophoretic particle and a blue electrophoretic particle.

11. A driving method of a display device, wherein:

the display device comprises a plurality of pixels, wherein the pixel comprises N subpixels whose pixel electrode areas are not equal to each other, a subpixel is capable of displaying M grayscales, and both N and M are integers not less than 2, wherein a ratio of pixel electrode areas of two of the N subpixels is at least 2, meaning one pixel electrode are is at least twice the size of another pixel electrode area and wherein the display device comprises a plurality of gate lines and a plurality of data lines; and the subpixel comprises a switching transistor, a control terminal of the switching transistor is electrically connected to the gate line, an input terminal of the switching transistor is electrically connected to the data line, and an output terminal of the switching transistor is electrically connected to a pixel electrode; and the driving method comprises:

during display of a frame of image: controlling duration of a data voltage on a pixel electrode of the subpixel, so that the subpixel displays a target grayscale, wherein the target grayscale is any one of the M grayscales, and grayscales displayed by the N subpixels are combined to present displayed grayscales of the pixel;

displaying an initial grayscale of the subpixel before the frame of image is displayed, wherein the initial grayscale is any one of the M grayscales; and the controlling duration of a data voltage on a pixel electrode of the subpixel, so that the subpixel displays a target grayscale comprises:

providing, by a gate line, a scan signal to control a switching transistor to be turned on, to write the data voltage to the pixel electrode by using the data line, wherein the subpixel is switched from the initial grayscale to the target grayscale under control of the data voltage, the duration of the data voltage is T, and T=m*t, wherein m is a positive integer not less than 1, and t is a scanning period at which the gate line provides a scan signal.

12. The driving method of claim 11 wherein the ratio of pixel electrode areas of two of the N subpixels is $X^n$, $2 \le X \le M$, and n is an integer not less than 1.

13. An electronic paper, comprising a display device, wherein the display device comprises:

a plurality of pixels, wherein the pixel comprises N subpixels whose pixel electrode areas are not equal to each other, each of the subpixel is capable of displaying M grayscales, and both N and M are integers not less than 2, wherein:

the electronic paper comprises a plurality of gate lines and a plurality of data lines; and the subpixel comprises a switching transistor, a control terminal of the switching transistor is electrically connected to the gate line, an input terminal of the switching transistor is electrically connected to the data line, and an output terminal of the switching transistor is electrically connected to a pixel electrode; and the electronic paper is configured to display an initial grayscale of the subpixel before the frame of image is displayed, wherein the initial grayscale is any one of the M grayscales and the controlling duration of a data voltage on a pixel electrode of the subpixel, so that the subpixel displays a target grayscale comprises:

providing, by a gate line, a scan signal to control a switching transistor to be turned on, to write the data voltage to the pixel electrode by using the data line, wherein the subpixel is switched from the initial grayscale to the target grayscale under control of the data voltage, the duration of the data voltage is T, and T=m*t, wherein m is a positive integer not less than 1, and t is a scanning period at which the gate line provides a scan signal.

14. The electronic paper according to claim 13, wherein a ratio of pixel electrode areas of two of the N subpixels is $X^n$, $2 \le X \le M$, and n is an integer not less than 1.

15. The electronic paper according to claim 14, wherein:

the N subpixels comprise a first subpixel, a second subpixel, . . . , and an $N^{th}$ subpixel; and a ratio of a pixel electrode area of an $(R+1)^{th}$ subpixel to a pixel electrode area of an $R^{th}$ subpixel is X, wherein $1 \le R \le N$, and R is an integer.

16. The electronic paper according to claim 15, wherein;

a proportion of the pixel electrode area of the $R^{th}$ subpixel in a total pixel electrode area of the pixel is $P_R$, wherein $P_R = X^{R-1} * (X-1)/(X^N-1)$, $1 \le R \le N$, and R is an integer.

17. The electronic paper according to claim 13, wherein:

the display device comprises a plurality of gate lines and a plurality of data lines;

the subpixel comprises a switching transistor, and an output terminal of the switching transistor is electrically connected to a pixel electrode; and control terminals of switching transistors of the N subpixels are connected to a same gate line, and input terminals of the switching transistors of the N subpixels are respectively connected to different data lines.

18. The electronic paper according to claim 13, wherein:

the display device comprises a plurality of gate lines and a plurality of data lines;

the subpixel comprises a switching transistor, and an output terminal of the switching transistor is electrically connected to a pixel electrode; and input terminals of the switching transistors of the N subpixels are connected to a same data line, and control terminals of the switching transistors of the N subpixels are respectively connected to different gate lines.

19. The electronic paper according to claim 13, wherein a structure of the pixel is one of the following:

pixel electrodes of the subpixels are strip-shaped, and the N subpixels are sequentially arranged in a same direction;

pixel electrodes of the subpixels are block-shaped, and the N subpixels are arranged in an array;

pixel electrodes of at least some of the subpixels are ring-shaped, and the N subpixels are arranged in a nested manner; and pixel electrodes of at least some of the subpixels are L-shaped, and two adjacent subpixels in the N subpixels are arranged in a way that one of the subpixels is half-encircled by the other subpixel.

20. The electronic paper according to claim 13, wherein:

the pixel comprises at least a red pixel, a green pixel, and a blue pixel; and the display device comprises an optical filter layer, and the optical filter layer comprises a red optical filter unit, a green optical filter unit, and a blue optical filter unit, wherein the red pixel comprises the red optical filter unit, the green pixel comprises the green optical filter unit, and the blue pixel comprises the blue optical filter unit.

* * * * *